United States Patent

Lovell

(10) Patent No.: US 6,970,114 B2
(45) Date of Patent: Nov. 29, 2005

(54) GATE-BASED ZERO-STRIPPING, VARYING LENGTH DATUM SEGMENT AND ARITHMETIC METHOD AND APPARATUS

(75) Inventor: William S. Lovell, Lincoln City, OR (US)

(73) Assignee: Wend LLC, Lincoln City, OR (US)

(*) Notice: Subject to any disclaimer, the term of this patent is extended or adjusted under 35 U.S.C. 154(b) by 0 days.

(21) Appl. No.: 10/462,868

(22) Filed: Jun. 16, 2003

(65) Prior Publication Data

US 2003/0206124 A1 Nov. 6, 2003

Related U.S. Application Data

(62) Division of application No. 09/323,153, filed on Jun. 1, 1999, now Pat. No. 6,208,275, and a division of application No. 09/690,859, filed on Oct. 18, 2000, now Pat. No. 6,580,378.

(51) Int. Cl.[7] .............................................. H03M 9/00
(52) U.S. Cl. ...................................... 341/100; 341/101
(58) Field of Search ................................. 341/100, 101

(56) References Cited

U.S. PATENT DOCUMENTS

| 4,813,056 A | * | 3/1989 | Fedele | 341/107 |
| 4,885,584 A | * | 12/1989 | Dalrymple | 341/101 |
| 5,387,911 A | * | 2/1995 | Gleichert et al. | 341/95 |
| 6,208,275 B1 | * | 3/2001 | Lovell | 341/100 |
| 6,580,378 B1 | * | 6/2003 | Lovell | 341/100 |

* cited by examiner

Primary Examiner—Michael Tokar
Assistant Examiner—Lam T. Mai
(74) Attorney, Agent, or Firm—William S. Lovell

(57) ABSTRACT

A zero stripper (10) accepts individual bit sequences marked off by a break codes in a bit stream, deletes any leading "0" bits from such bit sequences so as to form a zero-stripped datum segment, counts the number of bits in each resultant datum segment, and then concatenates each such datum segment with the bit count of that datum segment into the code form nnnndddddd . . . , where the "n's" are the bit count and the "d's"are the successive bits. Substantial bit space in transmission in thus saved. A "type code" "tt" can also be added if defined in the original data. The zero-stripped data can be reconstituted at the receiving end if needed, i.e., if the receiving device accepts only fixed length bytes. Also included are new and simple arithmetic routines.

16 Claims, 4 Drawing Sheets

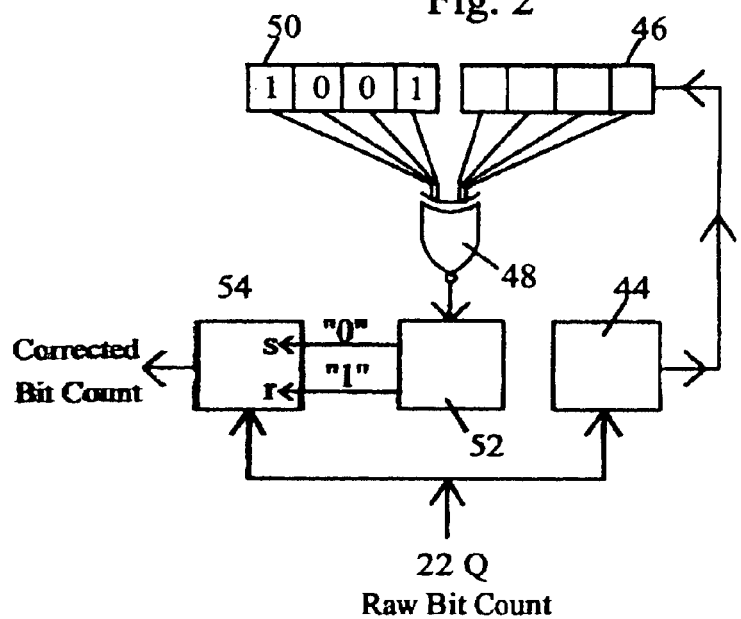
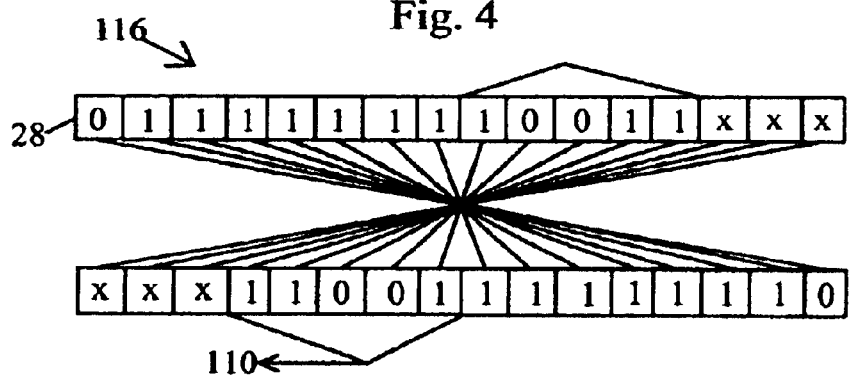
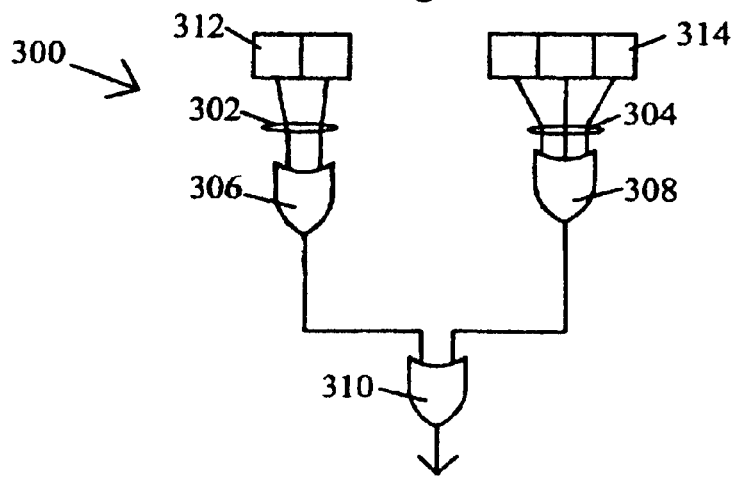

GATE-BASED ZERO-STRIPPING, VARYING LENGTH DATUM SEGMENT AND ARITHMETIC METHOD AND APPARATUS

CROSS-REFERENCE TO RELATED APPLICATIONS

This application relies on the priority of and is a div of application Ser. No. 09/323,153, filed on Jun. 1, 1999 and issued in part on Mar. 27, 2001 as U.S. Pat. No. 6,208,275; and a div of U.S. patent application Ser. No. 09/690,859, filed on Oct. 18, 2000 as a Divisional Application of the above-listed App. Ser. No. 09/323,153, issued as U.S. Pat. No. 6,580,378 on Jun. 17, 2003.

STATEMENT REGARDING FEDERALLY SPONSORED RESEARCH OR DEVELOPMENT

Not applicable

BACKGROUND OF THE INVENTION

1. Field of the Invention

This invention relates to digital gate circuits, specifically to gate circuits that are adapted to accept a bit stream containing sequences of incoming bytes or datum segments that may have varying bit lengths, and further to a method of encoding such datum segments that includes specifying the bit length.

2. Background Information

In early commercial implementations of digital circuit technology, one principal operative datum other than the bit itself was the 4-bit "byte," selected both because it was of a size for which circuitry could be fabricated by the level of manufacturing technology then available, and because 4 was an integral power of 2 for purposes of convenient encoding and the future growth of chip sizes "M," following the pattern $M=2^n$, where n=2, 3, 4, . . . , and hence the series of possible "byte" or "word" sizes became 4, 8, 16, . . . . Except in connection with video transmissions, and in data compression as in Huffman coding, there has been little or no development of any digital data processing systems that are capable of operating on digital "bytes" of varying length. Those kinds of procedures have been adapted to the particular circumstances of those cases, but perhaps because of that standardization of chip sizes, do not provide any truly general method of handling variable length "bytes."

The number of distinct entries (e.g., addresses) obtainable from the different byte sizes indicated above is also given by M, e.g., a 12 bit byte yields $2^{12}=4096=4K$ memory locations. A sequence of 8 bits sufficed to encode the English alphabet, the ten Arabic digits, and a number of non-printing characters and a parity bit in ASCII code. Use of the 8-bit byte became standard and was employed in a wide range of applications, including the Internet and other communications. In that scheme, the term "byte" meant an 8-bit sequence, and longer bit sequences comprised "words" having the capacity for some number of 8-bit bytes, e.g., 2 bytes in a 16 bit word, 4 bytes in a 32 bit word, etc.

While that scheme accommodates substantial computing power, as the path sizes becoming available have increased to 64 or more, systems so constructed also become more wasteful. Many computer operations do not require very large words or bytes, and can be carried out using standard 8-bit bytes which, if operating in a 32-bit bus and CPU system, would leave 24 bits unused with each data transfer. If one sends an 8-bit byte over a 128-bit line one has effectively "wasted" 120 locations—fifteen 8-bit bytes— that might have been used otherwise. The concatenator of U.S. Pat. No. 6,208,275 issued Mar. 27, 2001, to the present inventor helps to eliminate that kind of loss by, for example, permitting concatenation of four 8-bit bytes prior to entry into the 32-bit system, or sixteen 8-bit bytes on a 128-bit line. A single addressing and READ cycle to acquire an instruction, or an addressing and WRITE cycle to record a result, will transfer 32 information bits instead of requiring four cycles (8 bits at a time).

To carry out numerical calculations the use of larger datum segment sizes becomes essential. Any large number can be expressed as the product of an argument and a "power of ten," but numbers such as pi ($\mu$) or epsilon ($\epsilon$) may need expression at very high resolution, i.e., by a number of significant figures that exceeds the capacity of the 8-bit byte. In attempting to carry out high precision calculations, indeed, it is very disruptive suddenly to encounter an exponential expression of a number. Even a 16-bit byte can express numbers in normal binary code only up to 5 significant figures as 65,535. To include both positive and negative numbers one bit is used to express the sign, hence a 16-bit byte can express numbers only to +/−32,768, or, in general, the number expression range $R_n$ of a byte of size n is given by $R_n=+/-2^{(n-1)}$. For a 32-bit byte $R_{32}=+/-2^{31}=+/-2,147,483,648$, while for a 64-bit byte the range is given by $R_{64}=+/-2^{63}=+/-9,223,372,036,854,775,808$.

There may also be operations that could be accommodated using words of other sizes than those that can be described by the standard formula $M=2^n$ or, through use of a concatenator and a data enumerator, integral multiples thereof. When those patents state that appropriate instances of the device can provide bytes having bit lengths of "any" size, e.g., 7 bits, 9 bits, etc., in the case of prime numbers in particular that could be done only by using 1-bit "bytes" to be concatenated together, i.e., when the device would have been constructed to act as a serial-to-parallel converter. Moreover, once such a word size had been selected, all of the data must be expressed in bytes of the same size. Lesser bit count data paths tend towards less waste of unused bit locations, but limit the range of data that can be treated, while the use of larger data paths that can express any range of data desired will tend towards more waste of digital space. Through this invention, however, both horns of that dilemma are almost entirely eliminated, by a system that accommodates "bytes" of variable length. Waste of digital space is virtually eliminated, while at the same time data that require large byte sizes to be expressed can be treated. Remnant amounts of wasted digital space arise only because the data treated does not add up exactly to the size of the available data path or register.

When treating text, the apparatus described in the '275 and '378 patents serves less well to eliminate wasted bus or ALU register space. The word "place," for example, can be expressed in ASCII code as five 8-bit bytes, or as a 40-bit word when excluding start and stop bits, but a system wherein word sizes are defined by $M=2^n$ is not adapted to treat words of that size in one piece as would be desired. Even a 32-bit bus is too small, and 64, the next larger size available under the $M=2^n$ formula, if transmitting the word "place" in ASCII code would leave 24 bits of wasted space.

Also, there may be operations that could be carried out in a 16-bit system with "perfect fit" as by having two 8-bit bytes, but other data at hand might have been expressible in code of varying sizes as, say, first a 4-bit byte and then a 12-bit byte. The operation in that case would require the use of two transmissions in a 16-bit system, unless there were some way of concatenating bytes of differing size, which the apparatus of the '275 and '378 patents cannot do. Thus, while that apparatus is very useful as to ASCII-encoded data or to any other system that had been designed to treat only bytes of a fixed size, that apparatus does not entirely eliminate the occurrence of wasted bus and ALU register space. Applicant is not aware of any case in which codes adapted to express the lengths of variable length bit sequences other than through varying numbers of bytes of a fixed size have been suggested, or variable length gates have been shown, applied, or even suggested to apply, for the purpose of reducing wastage of bit space in data processing systems.

Nearly complete resolution of that issue would be achieved in a system that accommodated words of varying size whereby in principle, except for the occasional collection of just a few "left over" bit locations, every bus or register location could be used in its entirety. The internet well illustrates that a number of problems would arise if byte sizes were allowed to vary. In order to identify those problems it is necessary to take note of the START and STOP bits. That method of delineating a byte of fixed size cannot be applied when the byte size is allowed to vary, since the location of the START and STOP bits would not be known. Some other means of delineating that byte size must be found.

Besides improving data transmission efficiency by zero stripping, the invention is also intended to encompass the transmission of numerical data in normal binary code wherein, e.g., 123 is transmitted not in ASCII code as "123" that requires three 8-bit bytes, but in normal binary code as 1111011. An advantage in so doing is that the number itself can be transmitted in 7 bits, or 8 if parity were used, or 10 counting START and STOP bits, rather than the 30 bits that would be required to transmit "123" in ASCII code (with START and STOP bits). (As will be seen below, additional "control code" is also required.) At the same time, it would be quite wasteful, for example, to have to express the number 2 by the complete binary code 00000010 in an 8-bit binary code, since only 2 bits would suffice. If it were not known that the bit sequence had only 8-bit bytes in it, however, there would be no way to detect whether a $10^{th}$ bit (as a "1" bit) was a STOP bit, was the last position of a 9-bit byte, or was another bit of a byte of some yet larger and unknown size. In fact, any earlier "1" bit might have been intended as a STOP bit in a byte of some size less then 8 bits. A system that treats bytes of variable length thus requires some unambiguous means, other than by position or a single bit, of establishing the size of each byte.

Variable length bytes can also be used for purposes other than communications, as in a computer, thereby to save memory and circuitry usage. That could not be accomplished unless there were variable gates and the like available within the computer. In any event, variable length gates must be used in order to form variable length bytes. The invention thus provides hardware that is centered around the variable length gates that are essential to the zero stripping process, encoding systems that can express the full meaning of varying length datum segments, hardware means for interpreting those encoding systems, and addressing methods for the reception, storage, and access to such data.

SUMMARY OF THE INVENTION

The invention comprises coding systems that identify individual datum segments of varying length within a serial bit sequence, and apparatus that manipulates those datum segments in the usual manner of gate circuitry except that any leading zeros therein are removed by a zero stripping process. The datum segments and the circuitry into which they are to be entered are made to be equal in size so as to avoid the "waste" that results when transferring binary data in such a way that bit locations are unused in the lines, buses, gates and other circuitry being used. Two types of coding systems are provided, in the first of which an 8-bit ASCII code is used as a "BREAK code," with the datum segment then following thereafter. In the second coding method, the number of bits that intervene between two BREAK codes is the size "n" of the datum segment, as counted out by a data enumerator derived from that described in U.S. Pat. No. 6,580,378, and the datum segment itself, represented generally by a series of "d's," follows immediately thereafter. The basic function of the zero stripper is to accept bit sequences expressed in the standard code with leading zeros, remove those zeros, and then provide the resultant datum segments in the latter code. The only parts of that system that need to be fixed in hardware are the number of bits in which the bit sizes of the datum segments are to be expressed and the precise BREAK code.

When using either of these codes, one or more bits as in "ttt" may be added to identify when a text-directed system is to be used or when data are to be interpreted instead as one or the other of the types of numerical data, i.e., ordinary binary, BCD, or any other number-directed code. The first coding system has an inherent limitation in that entry of a number for which the binary code is the same as the BREAK code is not allowed, since that would stop the data entry. The second coding system derives from the first, and is intended for general use.

With standard coding having been used initially, when such a data transfer is received the information therein is decoded within an asynchronous gate-based system commencing with a shift register that converts the serial data as received into parallel datum segments of lengths "n" as defined by the several segment sizes, and those datum segments can then be applied to gates or other circuitry of sizes that correspond to the sizes of those datum segments. Relative to an arbitrary starting address to which a first bit segment is transmitted, a starting address for a second variable length datum segment is provided by the formula $ADDRESS_2=ADDRESS_1+n_1+1$, where "$ADDRESS_1$" is that first starting address, which runs integrally from 1 to the maximum value available within the computer, $n_1$ is the length of that first data segment, and subsequent addresses $ADDRESS_2$, $ADDRESS_3$, etc., are derived in the same manner using datum segment lengths $n_2$, $n_3$, etc.

BRIEF DESCRIPTION OF THE SEVERAL VIEWS OF THE DRAWINGS

FIG. 2 shows a sub-circuit by which adjustment can be made in the value of a count as reported by a cyclical counter.

FIG. 4 illustrates an exchange circuit whereby the order in which if first connected in order the bits of a datum segment can be reversed from the order originally imposed.

FIG. 6 is an exemplary variable length OR gate having inputs taken from variable length registers.

DETAILED DESCRIPTION OF THE INVENTION

Figure 1:
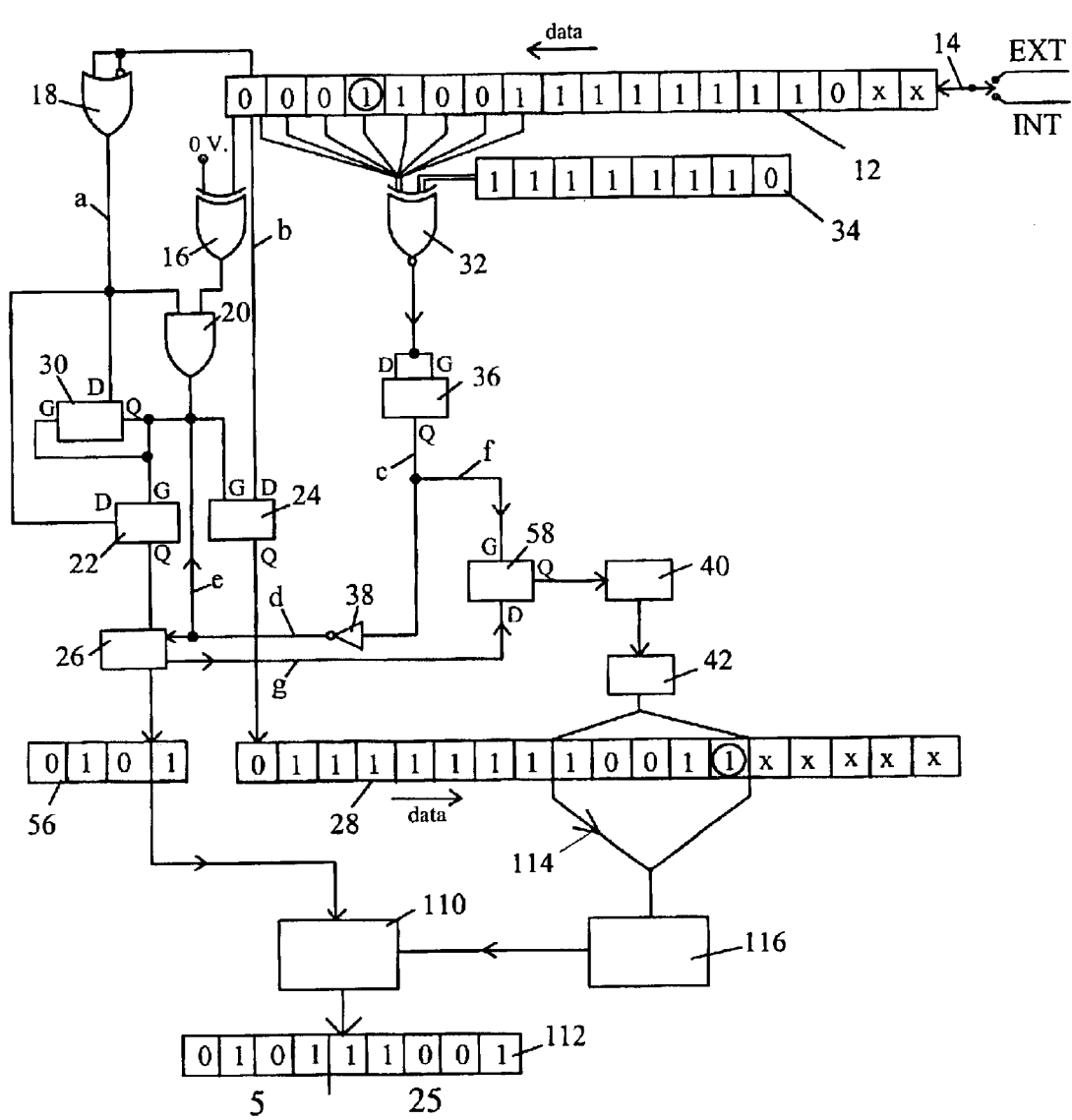
FIG. 1 shows a preferred embodiment of the zero-stripping, variable length datum segment invention.

At present, data communications methodology is designed principally in terms of the efficiency of the communications process, while the computers themselves are designed around the $2^n$ size components that have become a characteristic feature of the industry. However, the resulting systems do not operate with maximum efficiency, partly because of the number of steps involved in carrying out even simple operations, but also by way of wasted space—data that require only a few bits for their expression are treated by components that may be many times larger. Efforts to gain greater speeds of operation have been directed principally towards smaller components in terms of physical size and larger components in terms of data handling capacity, but as a part of the latter efforts, one consequence has actually been less efficiency, given that more space is wasted in sending a bit segment that is 3–4 bits in length over a 64-bit line than over a 32-bit line. This invention is a method and apparatus for using whatever the technology may be most efficiently, by which is meant that the data to be operated on are to be compacted for less waste of space. The number of available bit spaces that are committed but not utilized in the course of any computer operation is reduced as near to zero as possible. The procedures and apparatus so devised are to be applied both to textual and non-textual (i.e., numeric) data, and as to each of these there are particular data encoding problems.

Binary data may be intended to be interpreted as either AscII-encoded textual data or numerical (straight binary, octal, BCD, etc.) data. Ambiguity arises because the AscII codes for textual data, including control codes, also have meaning as the binary code for numbers. One way in which the desired interpretation of that code can be ensured is through an addressing system wherein ASCII data or binary encoded numerical data are identified by a flag and sent to a memory bank for access by the programs within the computer that are adapted to employ each type of data.

Before any such scheme could be implemented, however, it is necessary first to identify, within the code being received, which bit sequences are textual and which are numeric, and also the length of each data segment or datum. If data of fixed byte length were being transmitted, a simple way to make that distinction is to use the $8^{th}$ bit of each 8-bit byte not for parity purposes but rather to indicate whether the other 7 bits are to be interpreted as AscII-encoded textual data or as binary encoding of numerical data, both the manner of decoding and the memory bank to be utilized being identified at the same time, e.g., "1" means that the data are in ASCII form and are to go to "memory bank A," or a "0" means that the data are numeric and are to go to "memory bank B," after which any conversion as from BCD to binary or the like that might be needed would also be carried out. Although error-checking would then need to be carried out by other independent means, perhaps as by cyclical redundancy checks (CRC), the use of fixed-length bytes thus simplifies the process considerably. However, in order for the start- and end-of-message code not to be read as part of an enclosed message, it has been necessary to "pad" the data with extra bits, even though it is an object of the invention to eliminate redundant bits by zero stripping.

The following discussion will develop two different ways in which to encode data, and will describe a preferred embodiment of the invention by which such data are to be received and correctly interpreted. Out of incoming data that may be either textual or nontextual (numeric) and of varying bit lengths, the invention expresses the same data in bit sequences, now isolated as datum segments, of a length no greater than what is essential to express the data. To do so involves the following procedures, utilizing the indicated hardware components:

1. Remove any leading "0s" from each data element to provide a zero-stripped datum (shift register, OR, XOR gates);
2. Determine in each case the bit length of each such datum (cyclical counter);
3. Isolate the content of the datum (XNOR gate);
4. Provide a digital record of the bit length of each datum (data selector);
5. Provide a digital record of the content of each datum (datum segment register);
6. Concatenate together the record of the length of that datum and record of the content of that datum (concatenator); and
7. Restore the configuration of the circuitry such that the zero stripping process can again be initiated.

The following description of the invention will be based on the treatment of numeric data only, but the same processes would apply to any textual data that have leading zeros. For obvious reasons, any bit sequence that is intended to express a number must have within it or be accompanied by some indication of the point at which a particular number has ended. To describe this aspect of the invention, bit sequences that have been encoded to represent the values of numbers are presumed to be arriving consecutively, wherein different ones of such sequences may vary in size and contain varying numbers of leading "0s." As just noted, means by which to distinguish these bit sequences one from another must also have been provided. For illustrative purposes only, the 7-bit code 1111111 ("DEL" in ASCII) will be used herein as such an indicator, while noting that many other choices could have been made, e.g., both HDLC and SDLC use 01111110 as a "flag" to signify the beginning and end of a message. For the BREAK code, the 7-bit code 1111111 is selected to illustrate the process since it has no leading "0s" and hence would not be zero stripped. Also, the "DEL" code as normally used was defined to signal an erasure in paper tape punching that would not likely so be used in a computer context, hence the alteration in the normal ASCII code by that selection is minimal. Of course, another BREAK code could be selected without altering the spirit or scope of the invention.

What is to be avoided is not that what had been intended as the BREAK code might be read in its ASCII or numeric meaning, but rather that one might enter a bit sequence intending its ASCII or numeric sense but then have it act as the BREAK code. In order that the code selected as a BREAK code would not likely be used in its ordinary ASCII or numeric manner, one practice has been to enter that code twice in succession, in the text case to use an ASCII code that in the context could not be used as such in any meaningful manner and hence would likely never appear, or in the numeric case to use the code for some number that could not then be present in any data that were to be entered. The DEL code 1111111 also represents the number 127, hence one solution of this problem might lie in entering that number in as the sum of two other numbers (e.g., 63 and 64), whereby those numbers would of course have to be added together again later. These kinds of requirement are part of the reason for recommending the use instead of the second method of coding set out herein that relies on bit count and position.

Bit sequences to be operated upon by the invention might also come from within the computer itself. If variable length gates, buffers and the like are available, for purposes of maximum use of the hardware zero stripping can also be applied to existing data as usually stored in fixed-size bytes in the computer itself or perhaps in a scientific instrument attached to the computer. With the invention, data so stored can be conveyed through a P/S converter, zero stripped, passed through an S/P convertor, and then returned to memory free of superfluous leading zeros, thus freeing up some memory for other use. One common practice when treating 8-bit bytes, and similarly as to other sizes "m," has been to provide m chips, and one bit of the m-bit byte is placed in each chip. If variable length components are available, that practice would not be relevant, and memory storage routines could be devised on the basis, for example, of frequency of use of the data, but in any event for rapid access. In this and any other such case, once variable length components are available in a given system, all data intended for use therein would preferably have been encoded, most importantly without any leading zeros, but also in the second code to be set out below.

In the data enumerator of the '378 patent the indication that a new byte had arrived derives from a pulse response from an OR gate, on the basis of there being at least one "1" bit in a received byte, that pulse then passing into a cyclical counter. However, that procedure cannot apply to the reception of individual bits, some of which would of course be "0" bits. A new type of data enumerator thus had to be developed, based on the fact that the arrival of a new bit, either a "0" or a "1," can be made to yield a "1" bit, or a pulse, by connecting a selected 1-bit position on the shift register to an OR gate, both directly on one input to the OR gate and through an inverter on a second input. Regardless of which position along the receiving shift register one elects to use to detect the arrival of new bits, the OR gate will yield a pulse on the output thereof, regardless of the value of each new bit. By continued operation in that fashion, the OR gate will yield a continuous stream of pulses at the output thereof that will closely coincide with the arrival of new bits, and appropriate connection of the OR gate to a cyclical counter will provide the circuitry needed to obtain a "running" bit count.

Reference is now made to FIG. 1 that shows zero stripper 10, in which to limit the size of the drawing the lengths of the bit sequences therein are limited to 18 bits. Data sequences enter shift register 12 from the right, commencing with the MSB. Shift register 12 is a "data receiving means" by which the subsequent steps in the zero stripping and other processes are implemented. Entry of the data stream to be operated on is shown by first arrow 14 of FIG. 1, wherein the particular datum segment sought to be isolated out of that data sequence and used as an example throughout this discussion has been given the value 25, and appears in 8-bit binary code as 00011001. (In what follows, when the context requires reference to more than one datum, the term "datum segments" will be used in lieu of the more natural "data" in order to avoid confusion with the "data" arriving in non-zero-stripped form into shift register 12.) That datum segment is followed by the BREAK code, i.e., the 7-bit "DEL" code=1111111, and finally by a "0" bit, that together with the datum segment are seen to encompass the first 16 positions on the left in shift register 12. (The term "FULL BREAK code" is used hereinafter to designate the BREAK code 1111111 together with that "0" bit.) The "0" bit identifies the end of the BREAK code, whereby the circuitry is re-configured to accept the next data sequence. The bit content of the positions coming after the datum segment and FULL BREAK code have no bearing on the present analysis, and are shown in FIG. 1 merely as a neutral "x."The method and apparatus of the invention can be applied to data that are within or connected to the computer or for communications purposes as discussed herein, as indicated respectively by the labels "INT" (internal) and "EXT" (external) in FIG. 1. In any of these cases, however, the data being communicated must have been encoded to contain the specific FULL BREAK code for which the particular instance of the invention had been configured.

The operation of zero stripper 10 commences with shift register 12 and first XOR gate 16. One input terminal of first XOR gate 16 is connected to the first (most leftward) position of shift register 12, and the second input terminal of first XOR gate 16 is connected to a "0" input. (A "0" bit is represented by "0 V.") First XOR gate 16 will thus yield an output "1" bit only upon the arrival of a "1" bit at the location of shift register 12 to which first XOR gate 16 is connected, shown in FIG. 1 to be that leftmost position.

Next, OR gate 18 connects on its input side to one position on shift register 12, both directly through one input line and through an inverter on a second input line. Any position on shift register 12 can be used to make these connections, since upon receipt of a new bit at the input of shift register 12, a "new" bit will be transferred into every other position. In what follows, however, the connections of OR gate 18 to shift register 12 are taken to be at the first position on shift register 12 as shown in FIG. 1. OR gate 18 will thus yield a pulse output upon the arrival of each new bit into shift register 12 and hence into the position to which OR gate 18 is connected, whether that bit is a "0" or a "1."

The outputs of both first XOR gate 16 and OR gate 18 connect as inputs to AND gate 20, and as the first step of the above 7 steps, with 0 volts on the other input terminal of first XOR gate 16 only a "1" bit at the first position of shift register 12 will cause a "1" bit output from first XOR gate 16 and hence (along with the pulse from OR gate 18) a "1" bit output from AND gate 20. That output from AND gate 20 connects to the "G" terminals of first and second latches 22, 24. As will be explained below, there would previously have been a "0" bit on the G terminals of first and second latches 22, 24, and that "0" bit on those G terminals will have precluded the passage of any data from the input terminals D of first and second latches 22, 24 to the Q outputs thereof. Data arrive at respective first and second latches 22, 24 on line "a" from OR gate 18 as to the D terminal of first latch 22, and on line "b" from the first position of shift register 12 as to the D terminal of second latch 24. Any "0" bits appearing at the first position of shift register 12 prior to the appearance thereon of a "1" will not then be seen beyond the input side of first XOR gate 16, and no count of those leading "0" bits will have been made, i.e., the data sequence arriving at the input of shift register 12 will have been "zero stripped."

The appearance of a "1" bit at the first position of shift register 12, which from the code 00011001 for the number 25 is seen to be the fourth bit thereof (shown encircled in shift registers 12 of FIG. 1), will cause a "1" bit to appear at the output of first XOR gate 16, as a result of which any input to the D terminals of first, second latches 22, 24 will be allowed to pass on to the Q output terminals thereof. As to first latch 22, each bit (either "0" or "1") that appears on the first position of shift register 12, whether a "0" or a "1,"

will produce a "1" bit on the D terminal thereof. That "1" bit will pass to first cyclical counter 26 and cause a first count of the number of bits in the datum segment 00011001. As to second latch 24, that "1" bit at the first position of shift register 12 will appear at the D terminal thereof and pass therethrough to the first (leftmost) position of datum segment register 28. (How that first "1" bit comes to arrive at the position in datum segment register 28 shown (still encircled) in the lower portion of FIG. 1 will be explained below.) No leading "0s" will have appeared in datum segment register 28 but at this stage of the process only the first "1" bit in the data sequence being received, and the bit count would have been initiated with one count.

Third latch 30 connects at its D terminal to the output of OR gate 18 and on its G and Q terminals to the G terminals of first, second latches 22, 24, which is also the output of AND gate 20. As will be seen below, the termination of every datum transfer, meaning the complete transfer of a datum segment and FULL BREAK code, will place a "0" bit on the G terminals of first—third latches 22, 24, 30. That action provides the conditions necessary for execution again of the zero stripping process, i.e., any leading "0s" in a next data sequence to enter shift register 12, if any, will be stripped out, and during that process there will be no input to first cyclical counter 26. Correspondingly, only the first "1" bit in the bit stream entering shift register 12, and then all bits thereafter in that datum segment, will enter datum segment register 28. However, it remains to be shown how any "0" bits following the first "1" bit in a datum segment will be both counted and recorded in register 28, whereas those preceding a first "1" bit are not.

What is needed for the processes both of counting bits and adding those bits to register 28, to allow it to continue as to any "0" bits following the first "1" bit appearing on shift register 12, is a source for a "1" bit on the D terminals of first and second latches 22, 24 other than the output of AND gate 20. The source of that "1" bit, so as not to have a "0" bit that would have arrived after a first "1" bit become stripped as are "0" bits arriving before that first "1" bit, lies in the connections of the output of AND gate 20 to the G and Q terminals of third latch 30. Those connections preserve whatever output there might have been from AND gate 20 until that bit value is changed by another source. That is, until a first "1" bit had been received, the output of AND gate 20 had been a "0" bit, and had so remained until that first "1" bit was received and caused AND gate 20 to yield a "1" bit. The D terminal of third latch 30 will always have a "1" bit appearing thereon since that D terminal is connected to the output of OR gate 18 (which will be a "1" bit every time a bit enters shift register 12), hence that "1" bit on the G terminals of first and second latches 22, 24 will be maintained once it has first appeared, regardless of whether subsequent bits that arrive from shift register 12 are "1" or "0" bits. Moreover, that "1" bit on the G terminals of first and second latches 22, 24 also appears on the G terminal of third latch 30, hence that "1" bit on the D terminal of third latch 30 will continue to pass therethrough and then from the Q terminal thereof back to the G terminal thereof to which that Q terminal is connected, thereby to maintain the free passage of each "1" bit arriving from OR gate 18 onto the G terminals of first and second latches 22, 24. Until that "1" bit is removed by some other input, all data received thereafter from shift register 12, whether a "0" bit or a "1" bit, will both be counted and be entered into datum segment register 28, and in the example that will include the 4 more bits (1001) after that first "1" bit of the zero-stripped 11001 code for the number 25.

As to the bit count, however, the counting of the bits passing through shift register 12 and entering them into datum segment register 28 will necessarily continue on through the entry of the FULL BREAK code since it is only the FULL BREAK code that marks the end of a datum segment. (Clearly, one would wish to select a short BREAK code, since the system is effectively "idling" during the time it takes to transfer that FULL BREAK code into register 28.) A count so caused would over-count the bit length of the datum segment in an amount equal either to the 8 bits of the FULL BREAK code or the 7 bits of the BREAK code, depending upon the manner in which that counting error is addressed. Means must then be established whereby that count would be reduced either by those 8 bits of the FULL BREAK code or the 7 bits of the BREAK code. That reduction in the count will be carried out in the course of terminating the data collection process and reconfiguring the circuitry so as to begin the zero stripping process on the next-arriving data.

Termination of the data collection process centers on the operation of first XNOR gate 32, which connects on one input side thereof to the 8 leftmost positions of shift register 12, and on the second input side thereof to break code register 34 that has stored therein the FULL BREAK code 11111110. During the zero stripping and data collection processes, the data in the first 8 positions in shift register 12 would not have been the same as that in break code register 34, hence there would have been a "0" bit on the output of first XNOR gate 32. However, since zero stripping and data collection require different bit values on the G terminals of first, second latches 22, 24, being "0" for zero stripping and "1" for data collection, neither a "0" nor a "1" output from first XNOR gate 32 can have been connected to the G terminals of first, second latches 22, 24 during the time that those processes were being carried out. In order to establish again the conditions necessary for a next "round" of zero stripping, however, that connection must be made only when the data collection process (following the zero stripping) on a particular datum segment is completed.

That result is accomplished by fourth latch 36, since the output of first XNOR gate 32 is connected to both the D and G terminals of fourth latch 36. Since first XNOR gate 32 yields a "0" output on the G terminal of fourth latch 36 until there occurs a match between the first 8 bit locations of shift register 12 and break code register 34, first XNOR gate 32 will remain unconnected to the G terminals of first and second latches 22, 24 until there does occur a "1" output from first XNOR gate 32, and that period of time encompasses both the zero stripping and the data collection processes. The "0" or "1" bits that would have been on the G inputs of first, second latches 22, 24 for respective zero stripping and data collection purposes would then have remained undisturbed as required.

When the FULL BREAK code arrives at the leftmost 8 positions of shift register 12, the data in register 28 will be as shown near the bottom of FIG. 1, i.e., the FULL BREAK code (but in reverse order because of the direction of data flow) will be on the first 8 positions on datum segment register 28. What the content of those 8 positions might be is immaterial, however, since it is the coincidence of the data on the leftmost 8 positions of shift register 12 with the content of break code register 34 that will have terminated the process of data collection and reconfigured the circuitry for zero stripping. On the other hand, that 8 bits of some value must have entered register 28 is essential, since (a) it is only the arrival of that 8-bit FULL BREAK code into the leftmost positions of shift register 12 that would have "announced" the termination of the datum segment, the length of that datum segment not otherwise being known; and (b) exactly 8 bits of code must have entered register 28 in order to mark the position at which the datum segment of interest starts.

What is important now, however, is that a "1" bit be produced at the output of first XNOR gate 32. That "1" bit, unlike the previous "0" bits, will pass through fourth latch 36 onto line "c," since that "1" bit connects to the G terminal of fourth latch 36 as well as to its D terminal. That "1" bit then passes through inverter 38 so as to produce a "0" bit, and that "0" bit will appear on lines "d" and "e" that in that order to the G terminals of first—third latches 22, 24, 30. Data collection will thereby terminate, since no data can pass through first—third latches 22, 24, 30, each of which will have a "0" bit on the G terminal thereof. First—third latches 22, 24, 30 will also have been reconfigured to begin again the zero stripping process. At the same time, since the bit that completes entry of the FULL BREAK code is a "0" bit, that "0" bit will not, through the operation of first XOR gate 16 and OR gate 18, cause a "1" bit to appear at the output of AND gate 20, hence the "0" bit just placed at that output of AND gate 20 is left undisturbed.

What then remains is to extract from the foregoing operations the bit count and the datum segment on which the count was made, i.e., the bit count of 5 and the datum segment 25 in the example. As to the bit counting, it remains to record the bit count and reset the counter, the counting itself having been completed by blocking the passage of pulses from OR gate 18 through first latch 22 and eventually to first cyclical counter 26. Absent correction, however, the count so acquired will be in error, since besides counting the bits of the actual datum segment the counting process would also have counted the 8 bits of the FULL BREAK code, so correction must be made. The count so corrected will then be used to extract the relevant bits of the datum segment then held within register 28, commencing at the position marked on the basis of the length of the FULL BREAK code, which in this case means starting at the $9^{th}$ position on register 28. (It is to permit starting the extraction of the datum segment at the correct position along register 28 that an incoming bit sequence must employ a FULL BREAK code that has the exact length allowed therefor in register 28.) The corrected count and the datum segment will then be concatenated together into the form of a second, but now complete and unambiguous, method of encoding a series of independent binary data sequences. This method of encoding has none of the ambiguities of the first encoding method described herein, nor those of other extant encoding systems. This method also reduces to a minimum the waste of committed but non-used bit spaces, and is particularly adapted for use in data systems made up in part or entirely of variable bit length components.

As to obtaining a correct bit count, there are at least two different methods by which that might be accomplished. The simplest of these lies in adjusting the initial value of the cyclical counter, i.e., the value that the counter will be made to read upon being reset, to a value that will yield a "1," or 0001 in binary code, upon entry of the 9th bit of the full datum segment—FULL BREAK code sequence. "Raw" and "corrected" bit counts would then be as shown in the following Table I for datum segments of any accessible length, including the 5-bit datum segment used here as an example:

TABLE I

|  | reset | count | | | | | | | | | | | | | | |
|---|---|---|---|---|---|---|---|---|---|---|---|---|---|---|---|---|
| raw: | 0 | 1 | 2 | 3 | 4 | 5 | 6 | 7 | 8 | 9 | 10 | 11 | 12 | 13 | 14 | 15 16 . . . , |
| corrected: | −8 | −7 | −6 | −5 | −4 | −3 | −2 | −1 | 0 | 1 | 2 | 3 | 4 | 5 | 6 | 7 8 . . . . |

The "corrected" values in the second row of Table I would then be used out datum segments. Also, it does not matter that the bit actually counted in that $13^{th}$ count, for the 5 bit binary code of the datum segment of the example and assuming that the counter itself has a 0000 reset value, will be the "0" bit that completes the FULL BREAK code as shown by the content of datum segment register 28 in FIG. 1, with the 8 bits not to be counted being −7, −6, −5, −4, −3, −2, −1, and 0. Also, the size of the count field of the cyclical counter would need to be one bit larger than would otherwise be required for any selected largest number to serve, in effect, as a "−" sign. For present purposes it also does not matter what those later bits might be, but only that there are 8 of them. If the counter happened to have a normal reset value of 0001, and no 0000 value, the reset value would need to be set to −9 rather than −8.

Another method of obtaining a correct bit count would be to divert the first 8 bits of the actual count and only allow the $9^{th}$ bit, and those thereafter, to be counted, it being assumed that the cyclical counter resets to the binary value 0000, and using that number of bit positions as may be required to express the bit lengths of the datum segments that would be anticipated to be received. As shown in FIG. 2, that can be accomplished by a router that sends the first 8 counts from the Q output of first latch 22 to the "reset" "r" input of a cyclical counter, but then the $9^{th}$ count pulse is sent to the "signal" "s" input of the counter and is counted as the first bit of the datum segment.

For purposes of extracting the datum segment for which the bits thereof are being counted, it should first be noted that the sub-circuit now to be shown connects into data selector 40 of FIG. 1, that in turn connects into data release latch 42 and thence datum segment register 28 of FIG. 1. As to the circuit itself, FIG. 2 shows the Q output from first latch 22 to be connected to second cyclical counter 44, the bit count therefrom then connecting into break count buffer 46 that has four bit locations thereon, each of which connect separately to a first input side of second XNOR gate 48. (That "break count buffer" is given that name to distinguish it from other count buffers, not because it counts BREAK code bits, but rather the appearance of new bits that upon reaching 9 will have taken account of the number of bits in the FULL BREAK code.) Break count reference buffer 50 that also has four bit locations thereon connects separately to a second input side of second XNOR gate 48, and has entered therein the binary code of the number of bits in the FULL BREAK code plus one more bit, to yield 1001, as will be explained below. During the initial reception of "1" bit counts into break count buffer 46, the "running count" therein will not have the same code as the 1001 code=9 in break count reference buffer 50, hence second XNOR gate 48 will have a "1" output. That output from second XNOR gate 48 is shown in FIG. 2 to connect to router 52, that in turn connects to third cyclical counter 54. Router 52 is connected within itself so that with a "1" input thereto, bit count pulses from the Q output of first latch 22 that connect also to third cyclical counter 54 are caused to appear on the "r" terminal thereof, causing those bit count pulses not to be counted but instead to reset third cyclical counter 54 repetitively until a "0" bit is input into router 52.

At the time that a $9^{th}$ bit is passing through the circuit, break count buffer 46 counts 9=1001, the same as the code in break count reference buffer 50, hence second XNOR gate 48 will have a "0" output. Router 52 is further connected within itself so as to route the bit count pulses from the Q output of latch 22 to the "s" terminal of third cyclical counter 54 at the time that a "0" bit is placed on router 52, thereby to cause a count. In short, upon that match in count values being made a first count is also made and consecutively thereafter, thus to give a properly corrected count of the number of bits in a datum segment of any size that has been anticipated (by the sizes provided to shift register 12 and register 28) and can be used as previously described.

In effect, the corrected bit count is obtained by counting the bits in the full bit sequence, both of a datum segment and a FULL BREAK code, and then subtracting from that number the number of bits in the FULL BREAK code. The circuit shown in FIG. 2 is thus a general purpose, serial digital subtracting circuit, wherein as to the present case the bit length of the FULL BREAK code serves as the subtrahend and a full count of the bits of both the datum segment and the FULL BREAK code serves as the minuend. Those subtrahend and minuend fields could be variable length registers that within the size limits of the hardware would allow subtracting any integral number from any other larger integral number. In addition, the process of sending both the datum segment and the FULL BREAK code through this circuitry to get the total bit count for the two data elements indicates that the circuit of FIG. 1 is also a serial digital adding circuit. When used for that purpose alone, the bit count of none of a series of integral numbers to be added together would need to be known in advance, since no subtraction step need be carried out. Since the number of bits in any such data element that one might wish to use as a subtrahend could be counted separately, the circuitry of FIGS. 1, 2 taken together thus provides a basis for a complete serial, integer arithmetic unit.

Having acquired a correct bit count on the datum segment it must now be shown how that final bit count is recorded and used to extract the datum segment on which that count was made. FIG. 1 shows the "1" bit output of first XNOR gate 32 being sent to the G input of fourth latch 36. The count output of first cyclical counter 26 is being sent over line "g" to the D input to fifth latch 58 and also to first count buffer 56. First count buffer 56 is thus used as the final source of a correct count "n" of the datum segment, and sending that same count "n" to data selector 40 through fifth latch 58, by virtue of the "1" on the G input thereof from fourth latch 36, serves to effect the actual release of the datum segment.

Figure 3:
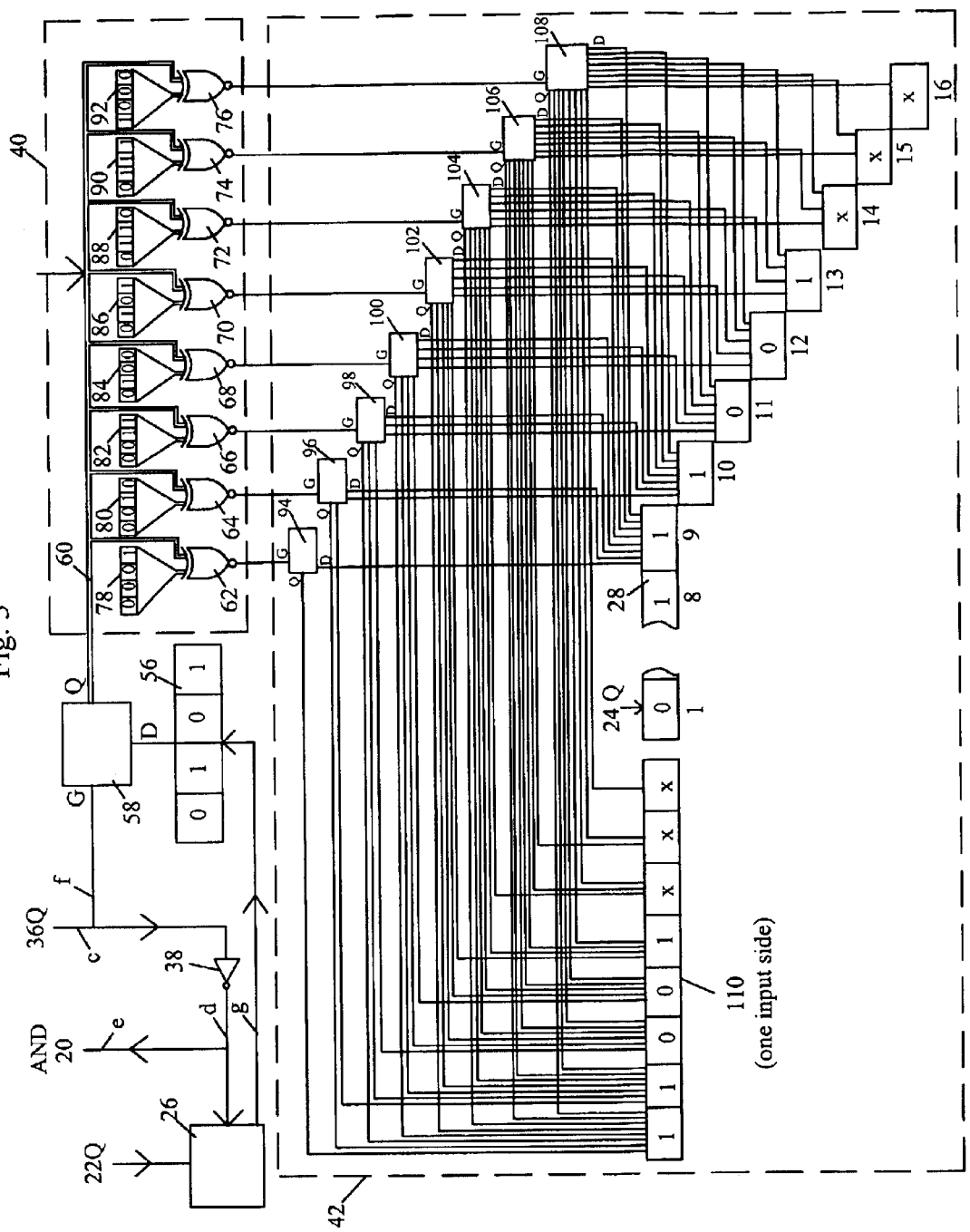
FIG. 3 shows in greater detail a cyclical counter, data selector and data release latch sub-circuit contained within FIG. 1 that establishes the length of each register segment into which each datum will be deposited, and that also effects that data transfer.

Specifically, FIG. 3 shows that when a "1" bit has arrived at the G and D terminals of fourth latch 36 from first XNOR gate 32, which was previously shown to have initiated the bit count process, a "1" bit from the Q output of fourth latch 36 will also be sent over lines "c" and "f" to the G terminal of fifth latch 58, while the 4-bit count data as it is being incremented will be sent from first cyclical counter 26 over line "g" to the D terminal of fifth latch 58. The 4-bit Q output of fifth latch 58 then connects to bit count bus 60 within data selector 40, which connects to one input side of third, fourth, fifth, . . . , tenth XNOR gates 62, 64, 66, . . . , 76. On the second input sides of third, fourth, fifth, . . . , tenth XNOR gates 62, 64, 66, . . . , 76 there are connected a series of first, second, third, . . . , eighth bit count reference buffers 78, 80, 82, . . . 92 that successively contain the values 0001, 0010, 1011, . . . , 1111. The outputs of third, fourth, fifth, . . . , tenth XNOR gates 62, 64, 66, . . . , 76 connect to a series of first, second, third, . . . , eighth datum release latches 94, 96, 98, . . . 108. The particular one of first, second, third, . . . , eighth bit count reference buffers 78, 80, 82, . . . 92 that contains the same 4-bit count value as that arriving from fifth latch 58 and is contained on bit count bus 60 will place a "1" bit on the G terminal of that one of a series of first, second, third, . . . , eighth data release latches 94, 96, 98, . . . 108 that firstly connects to the ninth position on datum segment register 28, secondly to the ninth and tenth positions, thirdly to the ninth, tenth, eleventh positions, . . . , and finally to the ninth through sixteenth positions of datum segment register 28 to which that one of third, fourth, fifth, . . . , tenth XNOR gates 62, 64, 66, . . . , 76 that produced a "1" bit as just described is connected, and will release the bit data of those locations on datum segment register 28 to which that particular data release latches 94, 96, 98, . . . 108 connects. As a result, a number of bits will be released for use that corresponds to the number of bits derived from the count n of those bits, i.e., the datum of interest on which the count was made is released along with that count n itself. FIGS. 1 and 2 show (as emphasized by the bracket in FIG. 1 and the arrow in FIG. 3) that the count n=5 or 0101 is held in fifth bit count reference buffer 88, which places a "1" bit on fifth data release latch 102, whereby the n count appearing on first count buffer 56, and the datum segment associated therewith made up of the content of the ninth—thirteenth positions of datum segment register 28, are released to concatenator 110. As shown at the bottom of FIG. 1, the n value and datum output then passed on to concatenator 110 provide the unambiguous data encoding shown for the present example in output register 112 as 010111001, meaning that the bit count was 0101=5 and the datum (after reversing its order because of the direction of flow into datum segment register 28) was the number 11001=25.

The 5 bits of the datum segment that are being extracted are shown in FIG. 1 as 10011, while in FIG. 3 those same bits, again reading from left to right, are in the order 11001, which of course is the desired code for the number 25. The 5-bit datum segment is sent to one side of concatenator 110 in parallel, but that change in order is accomplished by a reversal of the order of connection by sending those 5 bits of the datum segment into one input to concatenator 110 as though they had been sent in order serially in the direction shown by arrow second arrow 114 in FIG. 1. The encircled "1" bit in datum segment register 28 appears as it would had a serial transmission been used, and it had been sent last. It then appears as it should as the first of the 5 bits in the order shown in output register 112 of FIG. 1. The circuit that accomplishes that exchange is shown as exchanger 116 in FIG. 4. An alternative and probably better way to obtain the same result is to reverse the order of connection of the connected bits of datum segment 28 in connecting to the one input side of data release latches 94–108. As an example, in FIG. 3 the 5 bits of the datum segment of the example are not connected in the order first, second, third, fourth, and fifth, but rather fifth, fourth, third, second, and first. Consequently, the order in which the datum segment is to be extracted being a matter of intended use and engineering choice, an instance of the invention may or may not have imposed that exchanged order of connection, or included or not included exchanger 116, which may be fabricated in the form of a modular "add on" to be inserted into the circuitry as an option of the user.

The general form of the type of data encoding just derived is $$nnnnnnddddddddd\ldots, \tag{1}$$

where the n's express the number of bits in the datum segment dddddddddd . . . , and each particular "d" is the bit value, "0" or "1," at each position in datum segment dddddddddd . . . , that when taken together express the desired information. As noted earlier, that code can also be preceded by a type designator that specifies whether the datum segment is textual and will be expressed in ASCII or some similar code, in a binary representation of a number, in BCD, or in any other such format, for which 3 bits may be allocated so as to be able to encode for more than 3 different formats (in a 2-bit code only 4 types could be used), thus yielding:

$$tttnnnnnnddddddddd\ldots. \tag{2}$$

By a reading of ttt, the datum segment can then be routed to whatever circuitry in a computer or other device that has been constructed to operate on the particular type of data selected. This method of coding indicates the number of bits (in the above case 6) used to express the code count, but the formula itself can also be expressed in reduced form simply as "n," and similarly as to the type code, as "t."

Figure 5:
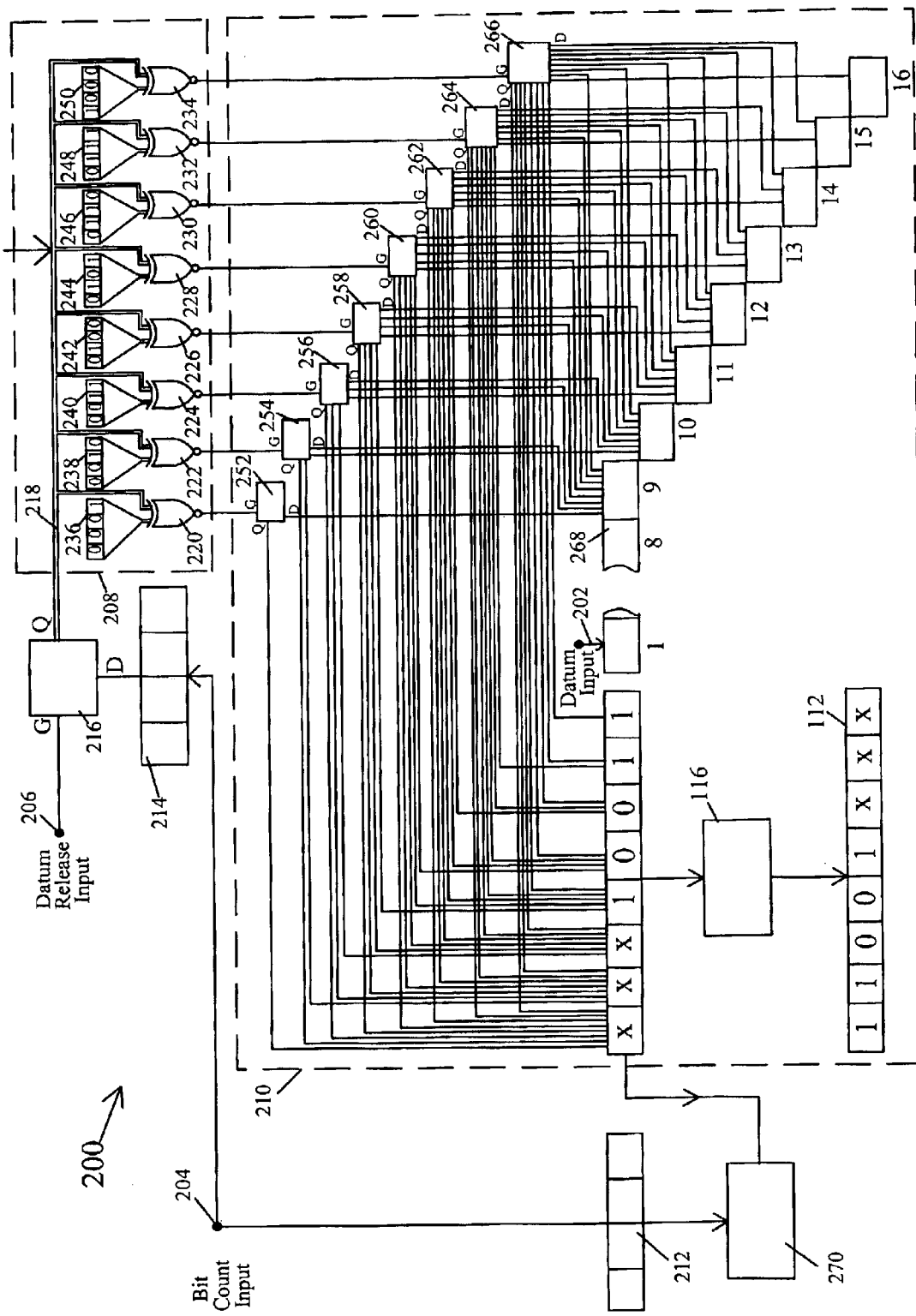
FIG. 5 is a generalized drawing of the variable length register component of the zero stripper of FIG. 1.

Taken together, data selector 40 and data release latch 42 constitute a general purpose variable length register that can serve to form variable length gates by serving as input to any ordinary gate circuit. Because of fanout, in some cases it may be necessary to form quite long variable length gates out of two or more smaller ones of the same type, or other standard procedures such as combining gates as taught by DeMorgan's Laws can be applied in this variable gate length context. For easier interpretation, a separate and newly referenced instance of the combination of circuits equivalent to data release selector 40 and data release latch 42, designated as variable length register 200, is shown in FIG. 5, in which the reversal of the order of connection to the release latches 94–108 as previously suggested is carried out. A list of components that are analogous to the corresponding circuit components in FIG. 1 is as shown in the following Table II:

TABLE II

| | |
|---|---|
| 200 | Variable length register |
| 202 | Data input |
| 204 | Bit count input |
| 206 | Data release input |
| 208 | Data selector |
| 210 | Data release latch |
| 212 | First count buffer |
| 214 | Second count buffer |
| 216 | Count latch |
| 218 | Count bus |
| 220 | First XNOR |
| 222 | Second XNOR |
| 224 | Third XNOR |
| 226 | Fourth XNOR |
| 228 | Fifth XNOR |
| 230 | Sixth XNOR |
| 232 | Seventh XNOR |
| 234 | Eighth XNOR |
| 236 | First bit count reference buffer |
| 238 | Second bit count reference buffer |
| 240 | Third bit count reference buffer |

TABLE II-continued

| | |
|---|---|
| 242 | Fourth bit count reference buffer |
| 244 | Fifth bit count reference buffer |
| 246 | Sixth bit count reference buffer |
| 248 | Seventh bit count reference buffer |
| 250 | Eighth bit count reference buffer |
| 252 | First datum release latch |
| 254 | Second datum release latch |
| 256 | Third datum release latch |
| 258 | Fourth datum release latch |
| 260 | Fifth datum release latch |
| 262 | Sicth datum release latch |
| 264 | Seventh datum release latch |
| 266 | Eighth datum release latch |
| 268 | Datum segment register |
| 270 | Concatenator |

First and second count buffers 212, 214 are shown as being separate in order to avoid having a long line passing through other components, but may actually be the same device as was shown previously.

To show this more generic circuit, the circuit needed had be illustrated as having some particular size (that again is 8 bits, although real instances of the circuitry would likely be many times larger), but in any case the operation of variable length register 200 commences with the entry of a datum segment of interest at data input 202, entry of the bit count on that datum as previously described at bit count input 204, and entry of a signal that will effect the release of the datum at data release input 206. The bit length of each datum segment is tracked by the bit counter procedures previously described as each bit is entered, and that running bit count enters into data selector 208 that will ultimately cause datum release latch 210 to release that datum segment upon receipt of a signal to do so.

The initial signal to release the datum segment arrives at data release input 206 upon the external circuitry recognizing some predetermined code in the manner described earlier. In the actual mechanism for that release the final value of that bit count, which is the value held when that predetermined code is recognized, besides being available at first count buffer 212 will also be conjoined with the datum segment itself to form the coding structure of Equation (1). The bit count is sent to second bit count buffer 214 that connects to the D input of count latch 216. Data release input 206 connects to the G terminal of count latch 216, and upon receiving an input from data release input 206, based on reaching a predetermined code (i.e., the FULL BREAK code in the example), count latch 216 releases that bit count through the Q output thereof to count bus 218 within data selector 208, which in turn causes the circuitry of data release latch 210 to release the datum segment.

That is, count bus 218 that now has on it the bit count 0101=5 is connected to a first input side of each of an array of 8 XNOR gates 220–234, and on the second input sides of each of XNOR gates 220–234 there is connected a series of 8 bit count reference buffers 236–250, which contain in sequence the encoded numbers from one to eight, i.e., 0001, 0010, 0011, etc., just one of which will contain the same value as the bit count on count bus 218. The outputs of XNOR gates 220–234 connect respectively to the G terminals of a corresponding array of each of 8 datum release latches 252–266, the D inputs of which connect consecutively to the first position on data segment register 268, the second and first positions, the third, second, first positions, and so on. Each datum release latch 252–266 has a corresponding number of Q output terminals that are individually matched to those input lines from data segment register 268.

(Each such datum release latch may in fact be an array of the proper number of 1-bit latches, with the output of a particular XNOR gate being connected to the G terminals of each of those of 1-bit latches, the Q outputs of which will similarly connect to the proper number of positions on data segment register 268.) Upon a particular datum release latch 252–266 having received an output from that one of XNOR gates 220–234 to which it is connected, the content of the number of positions on data segment register 268 to which that datum release latch is connected will pass through the datum release latch in question and then on to either one side of concatenator 270 or to some other register (not shown), the bit count itself being passed to the other side of concatenator 270, if used, to yield a conjoined result in the form of Eq. 1.

As to how a variable length register might be used, circumstances might arise in which as to two different data sources, there must be at least one "1" bit in each of them, for which an ordinary OR gate having a number of inputs equal to the sum of the numbers of bits from those two sources would not do. (For example, the two sources might be from the input and output sides of some other circuit, and one needs at least one "1" bit from each side in order to confirm that the two sides of the circuit are communicating.) FIG. 6 thus shows a variable length OR gate that would serve that purpose, in which the two sources are arbitrarily taken to include two and three bits, respectively. In the situation just posed, "1" bits that would yield an output from that OR gate could not just derive from anywhere in that total of five, but at least one "1" bit must have come from each of the two sources. How the need for a variable length register and hence variable length gate arises, rather than a conventional register and gate, is that one may not know how many bits will be in each of the two sources.

In detail, FIG. 6 shows variable length OR gate 300 having a 2-bit first input 302 and a 3-bit second input 304, wherein the respective numbers of bit sources are passed respectively through first OR gate 306 and second OR gate 308, the outputs of which then pass into third OR gate 310. Were it not known what the bit count would be in the data from first and second inputs 302, 304, both first OR gate 306 and second OR gate 308 would need to be variable length gates, by which is meant that the inputs to each would need to come from separate first and second variable length registers 312, 314. That the bit size of one or more data sources such as variable length registers 312, 314 would not be known in might come from the fact that some array of original data had been acted upon by zero stripper 10 of FIG. 1, and first and second variable length registers 312, 314 could have arisen from two different instances of data segment register 268 for which the incoming data happened to have different numbers of leading "0s." The ability also to apply the variable length techniques of zero stripper 10, and particularly of data selector 40 and datum release latch 42 (i.e., variable length register 200), to construct gate circuits that can accommodate zero-stripped data allows the creation of circuitry for which the circuitry that is intended to be served by those data, also constructed on variable length principles, will likewise exhibit no waste of bit space. Of course, the elements from which this or other variable length gates are to be made must also include the circuitry represented by the various OR, AND, etc. symbols, and the circuit design will lie in the connections of those standard components with variable length registers.

For example, the several positions along an extended variable length register may coincide with the base terminals of an array of transistors that would be connected in the form of particular types of gates, and the "memory addresses" ADDRESS$_x$," would have such base terminals connected thereto. That is, addressing of the data (i.e., one datum segment after another) may be carried out by assigning an initial 000000000000001 address (or whatever the size may be in a particular instance) to a first bit location in the blank slate on which the first bit from a zero stripper 10 might be deposited, which may be termed ADDRESS$_1$, and then the further development of the necessary addresses proceeds thereafter by the formula $$\text{ADDRESS}_x = \Sigma \text{ADDRESS}_{x-1} + n_{x-1} + 1 \tag{3}$$

over the range from 1 to x−1, where x extends up to the maximum value, shown above as being 32K. The starting address of the first bit of each newly following datum segment will depend on the length n of the preceding datum segment (and of course, cumulatively of all preceding datum segments), and for that purpose formula (1) becomes $$\text{ADDRESS}_x = \Sigma n_1 + n_x + 1, \tag{4}$$

i.e., where $n_x$ is the bit length in reduced form of the $x^{th}$ datum segment, and ADDRESS$_x$ is the next (i.e., using "+1") address after the sum of the bit lengths of all preceding datum segments "x" and of their associated bit count codes $n_x$, since these latter are also to be transmitted to the computer.

Register 28 of FIG. 1 and register 268 of FIG. 5 must both be large enough to accommodate the largest datum segment expected to be encountered, hence both registers, except for a datum segment that happened to be of that largest possible size, will provide a datum segment to the one input of concatenator 270 that will have one or more trailing "0" bits. (A number that filled the entire 32K register with no trailing zeros would need to have 32,768 significant figures.) Through the use of the addressing system just described, however, a second datum segment arriving as input to concatenator 270, that will be put into either the form nnnnnnddddddddddd . . . of Eq. (1) or the form tttnnnnnnnd-ddddddddd . . . of Eq. 2, would be deposited in memory in accordance with the expression ADDRESS$_x$=ΣADDRESS$_{x-1}$+$n_{x-1}$+1 of Eq. (3) or the expression ADDRESS$_x$=Σ$n_1$+$n_x$+1 of Eq. 4. That is, the first bit of that second datum segment would be placed in memory in the position immediately following the last bit of a preceding datum segment (whether or not that last bit was a "0"), and hence that second datum segment will simply "write over" any one or more trailing "0" bits associated with the first datum segment. Those trailing "0" bits of that first datum segment, and every other datum segment that is treated as was the second datum segment just noted, which of course would exclude the last datum segment to be treated, would have no effect, other than needing to have been transmitted from register 28 or register 268 and then from the output of concatenator 270.

Concatenation of a series of outputs of concatenator 270 in the indicated form, so as again to eliminate the waste of bit space in buses, registers and the like, cannot be carried out at present since, although concatenator 10 of the Lovell '275 patent on which the present invention is based can treat datum segments of any reasonable size, all of the datum segments sent to any one instance of zero stripper 10 that has in it a concatenator of the form in the '275 patent must be of the same size. Put another way, while zero stripper 10 can provide a series of outputs of the indicated forms in which a term expressing the bit size of a datum segment has been concatenated with the datum segment itself in accordance with the formulae either of Eq. 1 or Eq. 2, concatenator 270 cannot provide an output of the form $$nnnnnnddddddddd \ldots nnnnnnddddddddd \ldots nnnnnnd-ddddddddd \ldots, \quad (5)$$

except by sending successive outputs of concatenator 270 to memory addresses in accordance with the formulae of Eqs. (3) or (4), and then returning to that accumulated result and treating it as a single bit sequence.

The design and construction of other standard types of gates, e.g., AND, NOT, XOR, XNOR, etc., or various latches, routers, etc., could easily be carried out by a person of ordinary skill in the art, based on the present description of the manner of so doing, hence all such variable length gate variations are deemed to fall within the spirit and scope of the invention and of the claims appended hereto. Other arrangements and dispositions of the aforesaid or like components, the descriptions of which are intended to be illustrative only and not limiting, may also be made without departing from the spirit and scope of the invention, particularly in light of the ready applicability of the Boolean identities and De Morgan's Laws, particularly with regard to the possible usage of alternative gates, hence the true spirit and scope of the invention must be identified and determined only from the following claims and the equivalents thereof.

I claim:

1. A zero stripper adapted to remove leading "0s" from a bit sequence, comprising:

data receiving means (12) adapted to receive the bits of a digital bit sequence;

pulse generation means (18) adapted to form a pulse upon the receipt of each new bit into said data receiving means (12);

bit identification means (16, 18, 20) adapted to identify a bit as a "0" or a "1";

first bit switching means (20, 24) adapted to open a transmission path for said bit sequence upon the receipt of a first "1" bit within said bit sequence;

termination recognition means (32, 34) adapted to recognize the termination of a bit sequence;

second bit switching means (36) adapted to switch said transmission path of said bit sequence upon the recognition of said termination of a bit sequence;

datum release means (40, 42) adapted to release a datum segment made up of those bits received by said data receiving means (12) starting with a first-received "1" bit until said termination of a bit sequence; and datum receiving means (28) adapted to receive a zero-stripped datum segment made up of those bits received by said data receiving means (12) starting with a first-received "1" bit until said termination of said bit sequence.

2. The zero stripper of claim 1 further including at least a bit counting circuit, said bit counting circuit comprising:

latch means (22) adapted to control the counting of a number of received bits;

router means (52) for establishing a correct initial bit count;

bit counting means (26) adapted to provide a bit count of the number of bits in said bit sequence starting with a first-received "1" bit sequence until said termination of said bit sequence;

count release means (38, 44, 46) adapted to release said bit count near to the time that said datum release means (40, 42) releases said datum segment; and a count buffer (48) connected to said count release means (38, 44, 46) for accepting said bit count.

3. For zero stripping a series of more than one bit sequence arranged sequentially within a bit stream, individual ones of said bit sequences being separated one from the other by a full break code, the zero stripper (10) of claim 2 further comprising a latch (30) that, upon release of a datum segment and a bit count of said datum segment, reconfigures said zero-stripping circuit to a condition ready to be applied to a next-arriving bit sequence within said bit stream.

4. The zero stripper (10) of claim 2 further comprising a concatenator (110) to which are connected said count buffer (48) and said datum segment means (28), whereby said bit count and said datum segment can be concatenated together into the general data form $$nnnnddddddd \ldots.$$

5. The zero stripper (10) of claim 3 further comprising a concatenator (110) to which are connected said count buffer (48) and said datum segment means (28), whereby individual ones of said sequential bit counts and corresponding ones of said sequential datum segments can be concatenated together sequentially as to each sequential bit count and corresponding datum segment into separate general data forms $$nnnnddddddd \ldots.$$

6. A method for removing leading "0" bits from a digital bit stream containing a series of bit sequences having varying numbers of leading "0" bits therein and being separated one from the other by a full break code, comprising the following steps, some of which may be executed simultaneously rather than sequentially:

(a) provide data means for accepting a stream of data bits;

(b) provide means for detecting the arrival of each new said data bit into said data means;

(c) in a first configuration of said data means, successively remove any "0" bits from said stream of data bits until the reception of a first "1" bit;

(d) reconfigure said data means into a second configuration thereof such that any "0" bits following after said first "1" bit shall not be removed from said stream of data bits;

(e) continue passing any remaining bits in said stream of data bits through said data means until the last of said bits within said stream of bits has been so passed through said data means, thereby to provide a zero-stripped datum segment;

(f) determine the bit length of said datum segment;

(g) provide a record of said bit length of said datum segment;

(h) isolate the content of said datum segment;

(i) provide a record of said content of said datum segment;

(j) concatenate together said record of said bit length of said datum segment and said record of said content of said datum segment into a single record of the form $$nnnnddddddd \ldots,$$

where the series of "n's" is the binary expression for the bit count of a particular datum in as many such "n's" as may be deemed necessary to encompass the count of the longest datum sought to be expressed, and the "x's" are the successive bits of said particular datum;

(k) restore the configuration of said data means into said first configuration; and (l) repeat steps (a) through (k) as to a next stream of data bits.

7. A variable length register comprising:

a data input (202) connected to a data release latch (210), said data input (202) being adapted to transmit data segments that may vary in length into said data release latch (210);

a bit count input (204) connected to a data selector (208), said data selector (208) also being connected to said data release latch (210) and being adapted to select a datum segment from said data release latch (210) upon receipt of a datum release bit; and;

a data release input (206) connected to said data selector (208) so as to pass a datum release bit to said data release latch (210);

whereby to release a datum segment from said data release latch (210).

8. The variable length register of claim 7 wherein said data release latch (210) further comprises a data segment register (268) into which sequential bits of a data sequence are sent by said data input (202).

9. The variable length register of claim 8 further comprising a count latch (216) having said bit count input (204) connected to the D input thereof, said data release input (206) connected to the G input thereof, and the Q output connected to a count bus (218), whereby upon receipt of an appropriate signal on said data release input (206), a corresponding bit count on said count bus (218), a datum segment is caused to be released from said data segment register (268).

10. The variable length register of claim 8 further comprising:

a plurality of datum release latches (252–266), each of which connects on a first input side of said datum release latches (252–266) to said count bus (218);

a plurality of bit count reference buffers (236–250), equal in number to said plurality of datum release latches (252–266), each of said bit count reference buffers (236–250) being connected successively on a second input side of respective ones of said data release (252–266), wherein each of said bit count reference buffers (236–250) contains in succession the binary code for the numbers 1, 2, 3, . . . , up to and including the number of said datum release latches (252–266) and bit count reference buffers (236–250), whereby a correspondence will occur between a bit count held on said count bus (218) with the number held by just one of said bit count reference buffers (236–250), and that one datum release latches (252–266) to which said one of said bit count reference buffers (236–250) is connected will cause that same number of bits, commencing at a predetermined position, to be released from said data segment register (268).

11. The variable length register of claim 8 wherein a first one of said plurality of datum release latches (252–266) connects to a predetermined first position on said data segment register (268), the next consecutive one of said plurality of datum release latches (252–266) connects on separate lines both to said predetermined first position and to the next consecutive position on said data segment register (268), the next consecutive one of said plurality of datum release latches (252–266) connects on separate lines in succession to said predetermined first position, the next consecutive position, and the third position on said data segment register (268), said manner of connection being repeated thereafter until the last one of said plurality of datum release latches (252–266) connects individually to all of the positions on said data segment register (268), whereby if said code for said bit count on said count bus (218) corresponds to the code 0001 on said first bit count reference buffer (236), said predetermined first position on said data segment register (268) will connect through said first bit count reference buffer (236) to a first position on a first input of said concatenator (270), if said code for said bit count on said count bus (218) corresponds to the code 0010 on said second bit count reference buffer (238), said predetermined first position on said data segment register (268) will connect on a first line through said first bit count reference buffer (236) to a first position on a first input of said concatenator (270) and said next consecutive position on said data segment register (268) will connect through said second bit count reference buffer (238) to the next consecutive position on said first input of said concatenator (270), and thereafter in the same manner until the code on said count bus (218) corresponds to the code on the last consecutive one of said bit count reference buffers, and each consecutive position on said data segment register (268) will connect through respective ones of said bit count reference buffers (236–*) to corresponding ones of said positions on said first input of said concatenator (270), said code on said count bus (218) also connecting to a second input on said concatenator (270), where "*" represents a reference number for the last of said bit count reference buffers of an unknown number.

12. A variable length OR gate 300 comprising:

a first variable shift register (312) connected from two or more positions thereon to a number of inputs of first OR gate (306) corresponding to the number of said two or more positions on said first variable shift register (312);

a second variable shift register (314) connected from two or more positions thereon to a number of inputs of second OR gate (308) corresponding to the number of said two or more positions on said second variable shift register (314); and a third OR gate (310) connected on the input side thereof on respective single lines to both of said first and second OR gates (306, 308).

13. A method of encoding binary data comprising expressing a datum segment in the form nnnndddddd . . . , where the series of "n's" is the binary expression for the bit count of a particular datum in as many such "n's" as may be deemed necessary to encompass the count of the longest datum sought to be expressed, and the "x's"are the successive bits of said particular datum.

14. The method of claim 13 further comprising a code of the general form "ttt" that designates the type of coding used in a particular datum to be expressed.

15. A data enumerator comprising:

an OR gate at least having a single input line that connects further both directly to a first immediate input line into said OR gate and indirectly through an inverter to a second immediate input line into said OR gate;

whereby either a "1" bit or a "0" bit arriving on said single input line will cause a "1" output from an output of said OR gate; and a cyclical counter connected through a pulse input line to an output of said OR gate;

wherein said cyclical counter further comprises a reset line adapted to set the reading of said cyclical counter to a predetermined initial code upon receiving a signal on said reset line.

16. A zero-stripping integral number arithmetic unit comprising:
   data receiving means (12) adapted to receive the bits of a digital bit sequence;
   pulse generation means (18) adapted to form a pulse upon the receipt of each new bit into said data receiving means (12);
   bit identification means (16, 18, 20) adapted to identify a bit as a "0" or a "1";
   first bit switching means (20, 24) adapted to open a transmission path for said bit sequence upon the receipt of a first "1" bit within said bit sequence;
   termination recognition means (32, 34) adapted to recognize the termination of a bit sequence;
   second bit switching means (36) adapted to switch said transmission path of said bit sequence upon the recognition of said termination of a bit sequence;
   datum release means (40, 42) adapted to release a datum segment made up of those bits received by said data receiving means (12) starting with a first-received "1" bit until said termination of a bit sequence; and
   datum receiving means (28) adapted to receive a zero-stripped datum segment made up of those bits received by said data receiving means (12) starting with a first-received "1" bit until said termination of bit sequence;
   wherein upon entry into said data receiving means (12) of a first series of datum segments of varying bit length separated one from the other by a second series of datum segments of known bit length, and by counting the lengths of each of said first series of datum segments and of said second series of datum segments, a sum of the bit lengths of said datum segments in said first and second series of series of datum segments is provided; and
   wherein by separately extracting the bit length of each of said datum segments of said first series of datum segments of varying length knowing the bit lengths of said datum segments of said second series of datum segments;
   by using said sum as a minuend and the bit lengths of said datum segments of said second series of datum segments of known length as a subtrahend, the difference between said sum and said bit lengths of said datum segments of said second series will provide solely the sum of the datum segments of said first series of datum segments of varying length as a result of a subtraction process.

* * * * *